United States Patent [19]
Bocchicchio et al.

[11] Patent Number: 5,929,459
[45] Date of Patent: Jul. 27, 1999

[54] METHODS AND APPARATUS FOR INSPECTING A WORKPIECE WITH EDGE AND CO-PLANARITY DETERMINATION

[75] Inventors: Keith A. Bocchicchio, Elizabethtown; Joseph M. Bowling, Carlisle, both of Pa.

[73] Assignee: Synergistech, Inc., Lewisberry, Pa.

[21] Appl. No.: 08/935,755

[22] Filed: Sep. 23, 1997

[51] Int. Cl.$^6$ .................................................... G01N 21/86
[52] U.S. Cl. .................. 250/559.34; 250/559.22
[58] Field of Search ................ 250/559.22, 559.24, 250/559.26, 559.34, 559.36, 559.4; 356/376, 375

[56] References Cited

U.S. PATENT DOCUMENTS

| | | |
|---|---|---|
| 4,754,555 | 7/1988 | Stillman . |
| 4,959,898 | 10/1990 | Landman et al. . |
| 5,043,589 | 8/1991 | Smedt et al. . |
| 5,162,866 | 11/1992 | Tomiya et al. . |
| 5,212,390 | 5/1993 | LeBeau et al. . |
| 5,319,442 | 6/1994 | Rosser .................. 250/559.27 |

*Primary Examiner*—Que T. Le
*Attorney, Agent, or Firm*—Michaelson & Wallace; Peter L. Michaelson; John C. Pokotylo

[57] ABSTRACT

Systems and methods for inspecting a workpiece, such as a surface mount device. The systems and methods can determine the height, edges, and centers of leads of the surface mount device. The systems and methods also permit lead co-linearity and/or co-planarity values to be derived with relatively good repeatability.

25 Claims, 13 Drawing Sheets

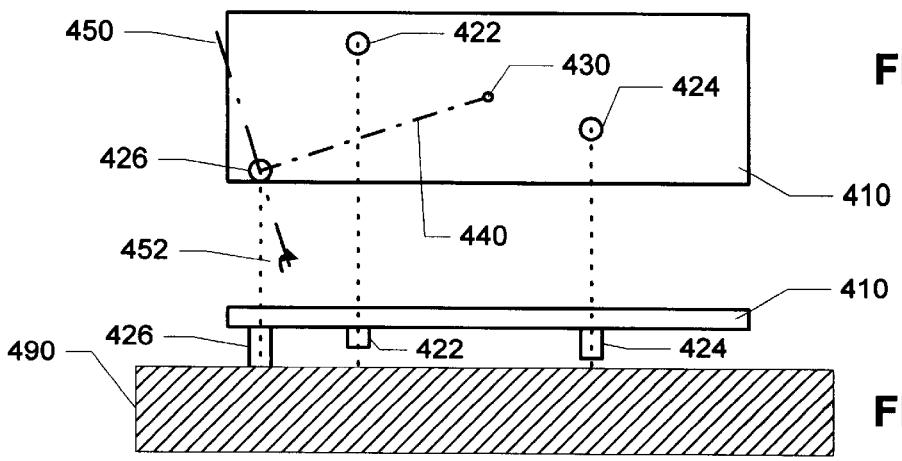
FIGURE 4a
FIGURE 4b
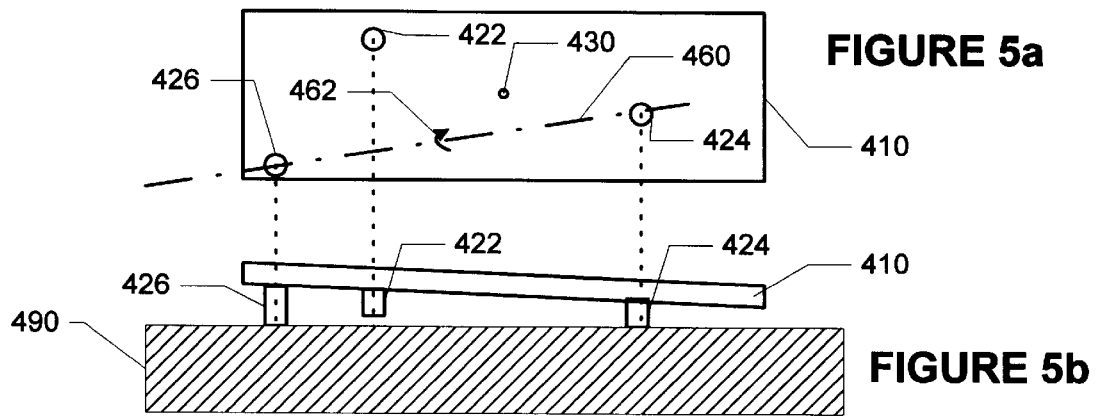
FIGURE 5a
FIGURE 5b
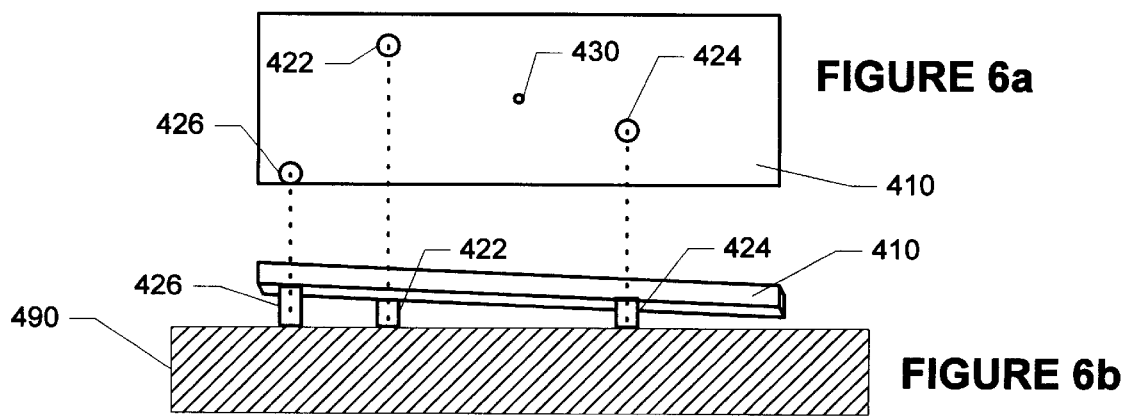
FIGURE 6a
FIGURE 6b

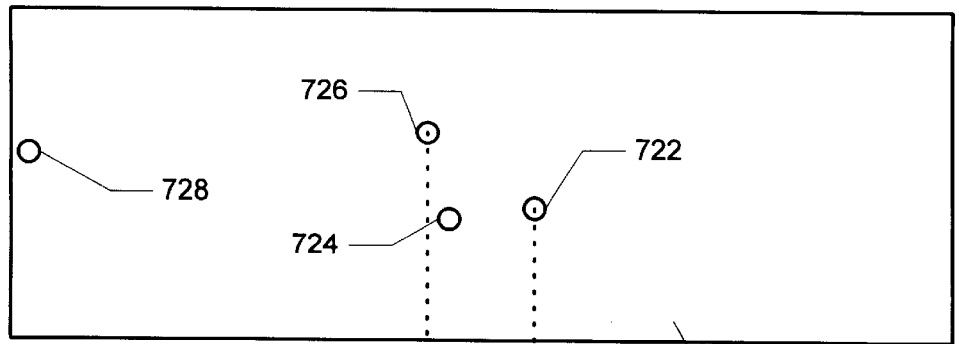
FIGURE 7a
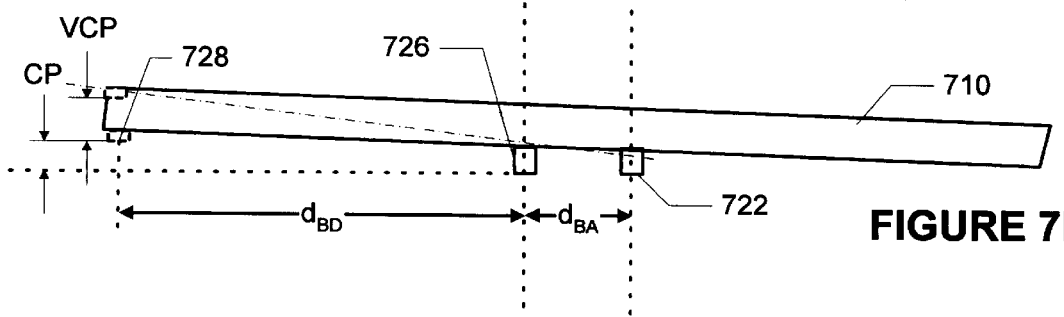
FIGURE 7b
FIGURE 8a
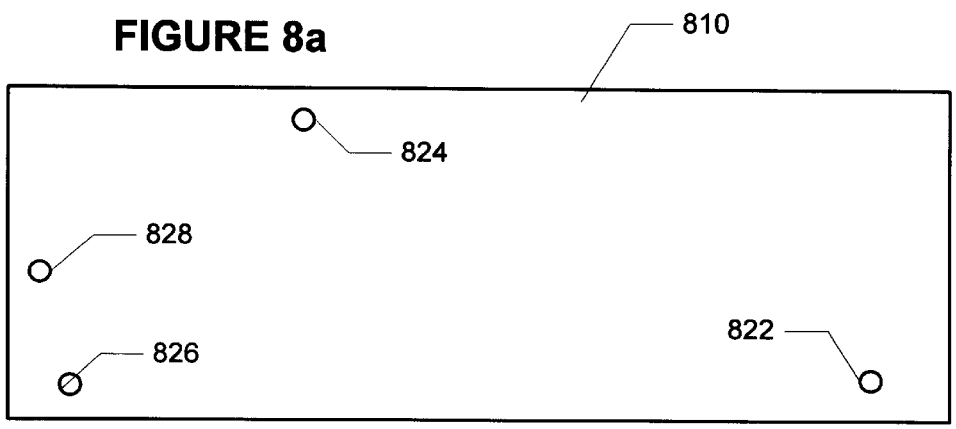
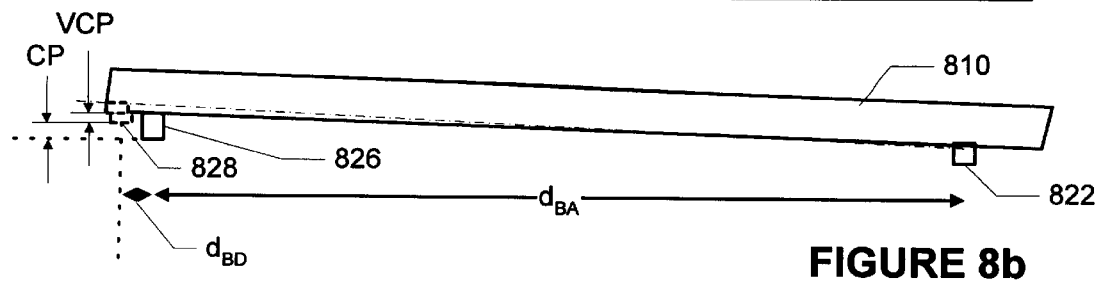
FIGURE 8b

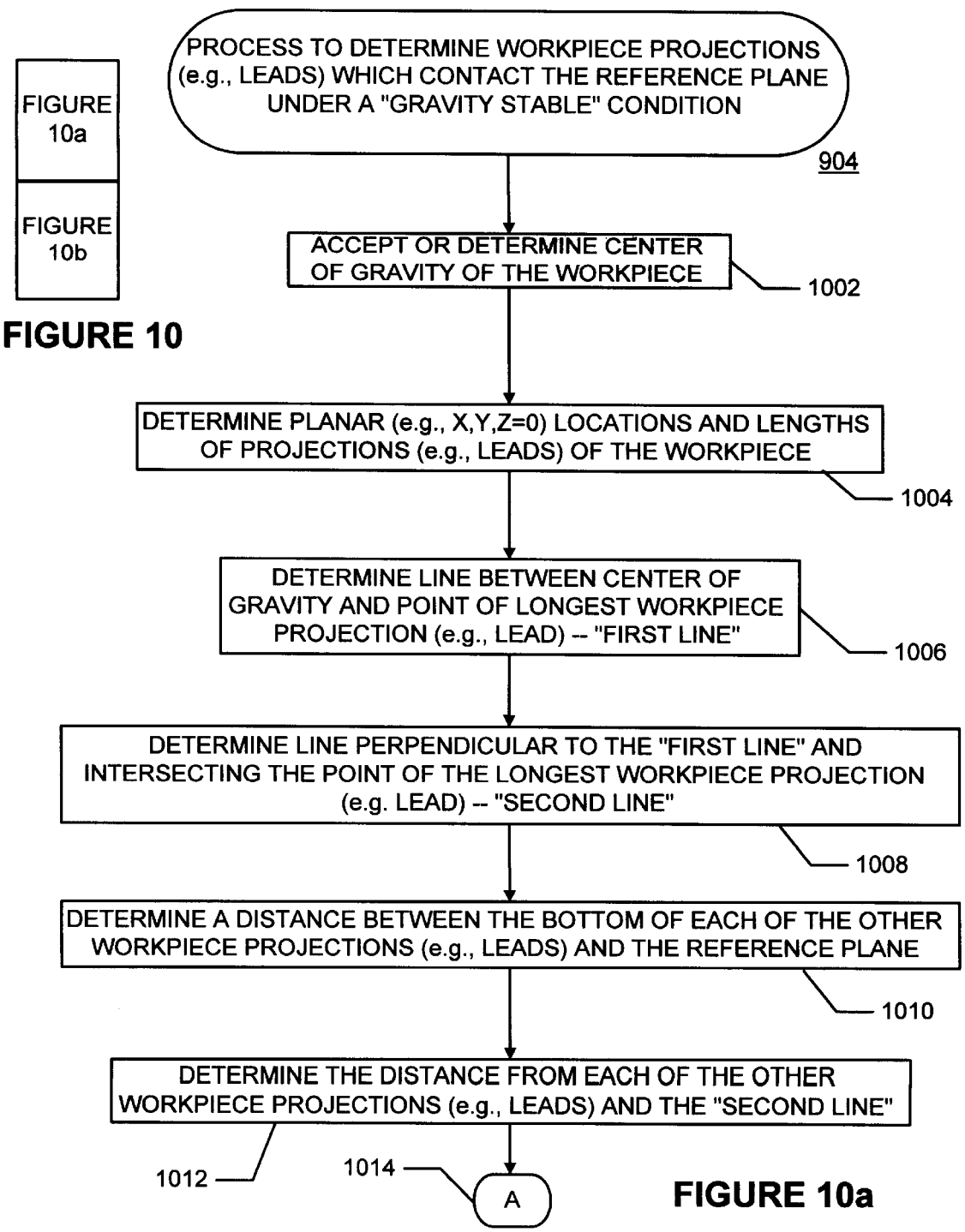

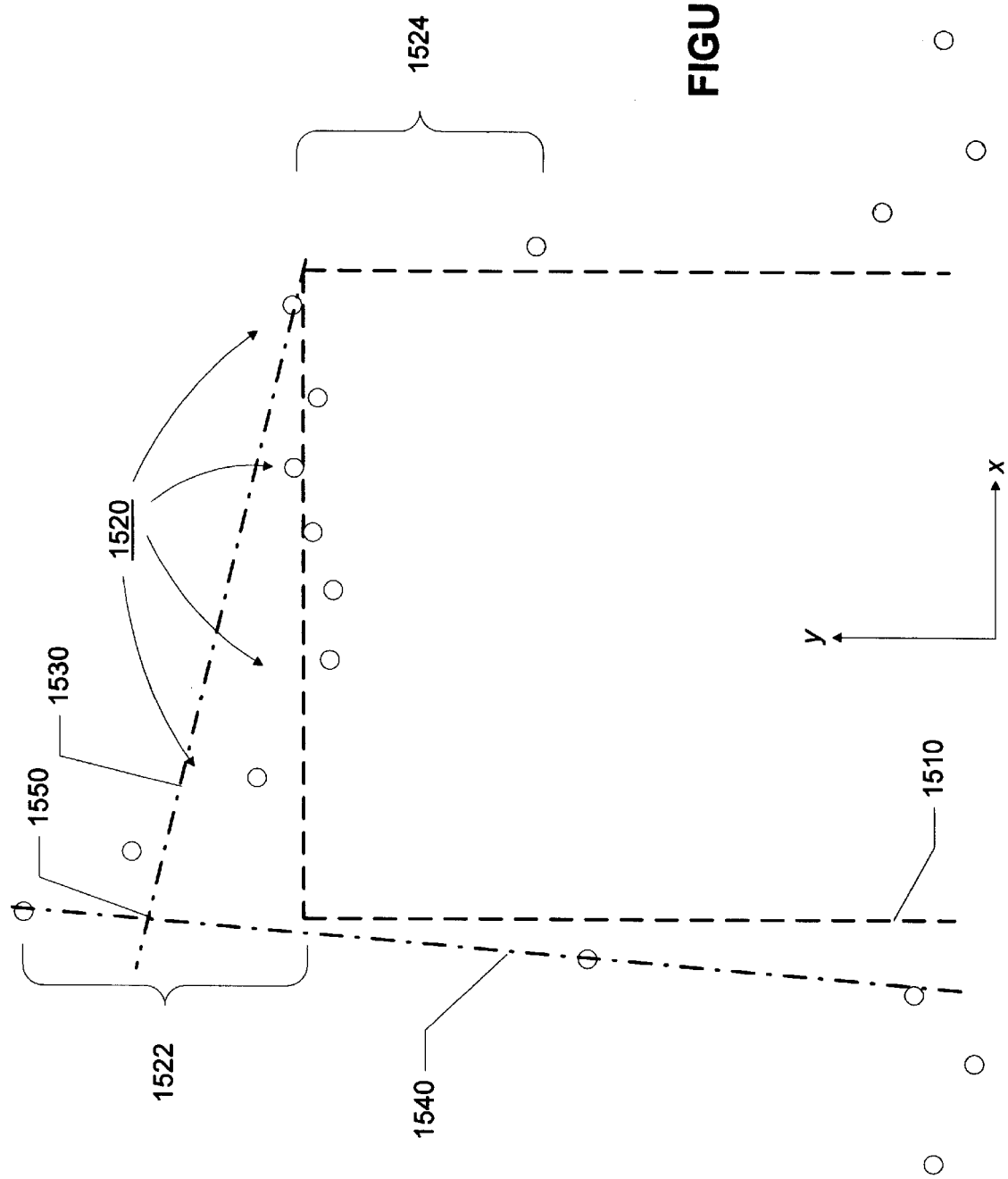

METHODS AND APPARATUS FOR INSPECTING A WORKPIECE WITH EDGE AND CO-PLANARITY DETERMINATION

BACKGROUND OF THE INVENTION a. Field of the Invention

The present invention concerns automatically inspecting a workpiece, such as inspecting leads of a surface mounted device for co-planarity. More specifically, the present invention concerns automatically inspecting a workpiece such that the repeatability of the inspection system is improved.

b. Related Art

The need to inspect manufactured products (hereafter referred to as "workpieces") is almost universally acknowledged. Inspecting workpieces serves a number of purposes. First, a customer for the workpiece may require that certain specifications (or tolerances) be met. Second, in anticipation of customer demands, internal quality assurance may require that the workpiece meet certain specifications. Finally, assuming the presence of customer or internal specifications, workpiece inspection may be used to analyze the manufacturing process. In this way, the manufacturing process may be improved to avoid defective workpieces. If workpieces fail inspection, they may be discarded, recycled, or repaired such that they can pass inspection—each of these options adding costs to the workpieces.

When inspecting workpieces, or when statistically analyzing experimental data in general, two concepts are important to understand—namely, accuracy and repeatability. Though these concepts are familiar to those skilled in the art, and indeed most engineers, scientists, and statisticians, a brief review is provided for the reader's convenience.

Accuracy of data corresponds to how close acquired data is to a true (actual) value. Systemic errors, i.e., those associated with a particular instrument or measurement technique, affect the accuracy of data. Repeatability may be defined as the degree to which measurements of the same quantity vary about their mean. Values of a workpiece may be directly measured or may be derived from direct measurements. If a value of the workpiece is derived from measurements, the repeatability of such a value may depend on how the measurements are used to derive that value. In general, the derivation should optimize the repeatability of such values.

Having defined and distinguished accuracy and repeatability, an exemplary workpiece inspection will now be discussed. The use of surface mount electronic packaging technology has been replacing the use of through-hole mount electronic packaging. More specifically, with through-hole mount electronic packaging, wire leads from components are inserted through holes in printed wiring boards. To increase packaging density and board reliability while reducing weight and cost, the use surface mount electronic packaging has replaced the use of through-hole mount electronic packaging in many applications. With surface mount electronic packaging, smaller electronic components are mounted on the surfaces of printed circuit boards. More specifically, the electronic components are (i) placed at appropriate positions on printed circuit boards (e.g., by in-line placement equipment, simultaneous placement equipment, sequential placement equipment, or sequential/simultaneous placement equipment) and (ii) soldered (e.g., by wave soldering, vapor-phase soldering, or infrared reflow soldering) to the printed circuit board.

To ensure that surface mount electronic components will be adequately soldered to the printed circuit board, the electrical leads from such components should be co-planar. For example, it is believed that if the non-co-planarity of the electrical leads of a surface mount component exceeds 0.004 inch, then the solder will not adequately "wick" to all of the leads. Thus, some purchasers of surface mount components require a lead co-planarity tolerance of 0.004 inch. Accordingly, either the purchaser or manufacturer of surface mount components, or some other third party, will need to test the co-planarity of the leads to determine whether or not they are acceptable. The leads of surface mount components may also be tested for linearity, true position, skew, profile, and absence.

If a surface mount component fails to meet a required tolerance (e.g., a co-planarity tolerance), it may be (a) discarded, (b) recycled, or (c) reworked and retested. Each of these options add to the cost of surface mounted components.

Since co-planarity is not directly measured, but is derived from lead measurements, in some tests for determining (e.g., surface mount component lead) co-planarity, variations (i.e., repeatability) in the co-planarity derived may be too large, often greater than the co-planarity tolerance. At times, such variations can cause an otherwise adequate workpiece to fail inspection. In such instances, adequate workpieces are unnecessarily discarded, recycled, or reworked and retested. This adds to the cost of producing the workpiece.

SUMMARY OF THE INVENTION

Thus, it is an object of the present invention to improve an inspection system or process such that variations in derived values (i.e., values not directly measured) are reduced; that is, such that the repeatability of the derived values is improved. It is a further object of the present invention to improve an inspection system or process such that variations (i.e., repeatability) in such derived values are less than, and preferably less than ten (10) percent of, a tolerance value.

The present invention provides a method for inspecting a workpiece having projections. The method includes steps of (a) accepting measurements of the workpiece, (b) determining edges of each of the projections based on the measurements accepted, (c) determining a height of each of the projections based on the measurements accepted, and (d) determining a center of each of the projections based on the edges determined.

The present invention also provides a method for inspecting a workpiece having projections, to determine a height of each of the projections. For each of the projections, this method includes steps of a) determining a width of a measurement sampling band, (b) initializing a position of the measurement sampling band, (c) counting a number of measurements within the measurement sampling band at its current position to determine a first count, (d) repositioning the band and repeating the step of counting the number of measurements within the measurement sampling band to determine a second count, (e) selecting the maximum of the first and second counts to determine a maximum count, and (f) averaging height values of measurements within the measurement sampling band associated with the maximum count to determine a projection height. If the maximum count is less than a predetermined threshold, then steps of (g) increasing a width of the measurement sampling band, and (h) repeating steps (b) through (f) may be carried out.

The method for determining projection heights may include further steps of (g) determining a least squares fit line through the determined projection heights, (h)

determining, for each of the projections, a distance between the projection and the least squares fit line, and (i) determining whether a co-linearity of the workpiece is acceptable based on the determined least squares fit line and the determined distances. The step of determining whether a co-linearity of the workpiece is acceptable may include sub-steps of (i) determining whether any of the distances exceeds a first threshold value, and (ii) if any of the distances exceeds the first threshold value, indicating a co-linearity failure. Alternatively, or additionally, the step of determining whether a co-linearity of the workpiece is acceptable may include sub-steps of (i) determining a sum of the distances, (ii) determining whether the sum of the distances exceeds a first threshold value, and (iii) if the sum of the distances exceeds the first threshold value, indicating a co-linearity failure.

The present invention also provides a method for inspecting a workpiece having projections, to determine an edge of each of the projections. For each of the projections, this method performs steps of (a) determining a width of a measurement sampling band, (b) initializing a position of the measurement sampling band, (c) counting the number of measurements within the measurement sampling band at its current position to determine a first count, (d) repositioning the measurement sampling band and repeating the sub-step of counting the number of measurements within the measurement sampling band to determine a second count, (e) selecting the maximum of the first and second counts to determine a maximum count, and (f) averaging values of measurements within the measurement sampling band associated with the maximum count to determine a projection edge. If the maximum count is less than a predetermined threshold, then further steps of (g) increasing a width of the measurement sampling band, and (h) repeating steps (b) through (f), may be carried out.

The method for determining projection edges may further include steps of (g) determining whether a bloom exists at the edge, and (h) if a bloom exists at the edge, compensating the edge measurement to reduce the effect of the bloom.

Finally, the present invention also provides a method for inspecting a workpiece having projections, to determine a co-planarity of the projections. This method includes steps of (a) accepting length measurements of the projections, (b) defining a reference plane, (c) determining at least three projections which contact the reference plane under a gravity stable workpiece condition, and (d) determining a co-planarity of the workpiece based on a distance of each of the projections to the reference plane under a gravity stable workpiece condition.

This method may further include a step of (e) determining a variability of the co-planarity determined. In such a case, the method may further comprise steps of (f) adding the variability of the co-planarity and the co-planarity to generate a value, and (g) comparing the value to a predetermined tolerance. If the value exceeds the predetermined tolerance, then further steps of (h) redefining the reference plane, and (i) repeating steps (c) through (g) may be performed. The step of redefining the reference plane may include a sub-step of rotating the reference plane about at least one of two orthogonal axes. Each of the two orthogonal axes may be perpendicular to gravity.

The step of determining at least three projections which contact the reference plane under a gravity stable workpiece condition may include sub-steps of (i) accepting a center of gravity of the workpiece, (ii) determining a projection closest to the reference plane to define a first projection, (iii) determining a line between the center of gravity and the first projection to define a first line, (iv) determining a line perpendicular to the first line and passing through the first projection to define a second line, (v) determining a direction of rotation about the second line towards the center of gravity, (vi) determining a distance, in the direction of gravity, between bottoms of each of the projections and the reference plane, (vii) determining a distance between each of the projections and the second line, (viii) determining a next projection to contact the reference plane, assuming that the workpiece rotates about the second line in the direction of rotation, based on (1) the determined distances between the bottoms of the projections and the reference plane and (2) the determined distances between each of the projections and the second line, to define a second projection, (ix) determining a line between the first and second projections to define a third line, (x) updating a distance, in the direction of gravity, between bottoms of each of the projections and the reference plane, (xi) determining a distance between each of the projections and the third line, (xii) determining a next projection to contact the reference plane, assuming that the workpiece rotates about the third line towards the center of gravity, based on (i) the updated distances between the bottoms of the projections and the reference plane and (ii) the determined distances between each of the projections and the third line, to define a third projection.

The step of determining at least three projections which contact the reference plane under a gravity stable workpiece condition may include a sub-step of determining whether the workpiece is gravity stable. More specifically, the step of determining at least three projections which contact the reference plane under a gravity stable workpiece condition may include a sub-step of, if the center of gravity is within a triangle defined by the first, second, and third projections, determining that the workpiece is gravity stable, and if the center of gravity is not within the triangle, determining that the workpiece is not gravity stable.

The present invention also provides apparatus for implementing the above discussed methods. These apparatus may include means, such as processor executed instructions, for performing each of the method steps. The processor may be part of a computer having storage device(s), input/output interface unit(s), and a system bus. These apparatus may further include a position sensing device such as a laser positioning system, and a three dimensional actuator.

BRIEF DESCRIPTION OF THE DRAWINGS

FIGS. 4a and 4b are plan and side-elevation depictions, respectively, of a device having one contact point on a reference surface on which the device will become gravity stable.

FIGS. 5a and 5b are plan and side-elevation depictions, respectively, of a device having two contact points on a reference surface on which the device will become gravity stable.

FIGS. 6a and 6b are plan and side-elevation depictions, respectively, of a device which has become gravity stable on a reference surface.

FIGS. 7a and 7b are plan and side-elevation depictions, respectively, of a gravity stable device having a lead whose co-planarity can be determined with relatively poor repeatability.

FIGS. 8a and 8b are plan and side-elevation depictions, respectively, of a gravity stable device having a lead whose co-planarity can be determined with relatively good repeatability.

FIG. 15 depicts laser measurement errors due to time delays in laser intensity adjustments.

DETAILED DESCRIPTION

The present invention concerns novel methods and apparatus for inspecting a workpiece. The following description is presented to enable one skilled in the art to make and use the invention, and is provided in the context of a particular application, i.e., determining the co-planarity of electrical leads, and its requirements. Various modifications to the preferred embodiment will be apparent to those skilled in the art, and the general principles set forth below may be applied to other embodiments and applications. Thus, the present invention is not intended to be limited to the embodiment shown.

Below, the purposes and functions of the present invention are first described. Then, an exemplary structure for practicing the present invention is described. Finally, an example of the operation of the present invention is described.

The present invention functions to determine (i) the lengths, widths and positions of projections (e.g., leads) of a workpiece (e.g., a surface mount component) and (ii) a co-planarity of the projections of the workpiece.

The present invention determines the lengths, widths and positions of the projections of the workpiece by scanning the workpiece with a position sensing device, such as a laser system (for example, Dyna Vision model LTS, sold by Dynamic Control Systems Inc.). Blooms caused by response time delays when transiting from light to dark or dark to light surfaces, which will be discussed below, are accounted for so that lead edges and lengths may be determined accurately.

The present invention determines the co-planarity of workpiece projections by determining a gravity stable position of the workpiece to a reference plane. An initial reference plane may be defined such that gravity is normal to the reference plane. If the determined co-planarity of the workpiece projections (with its repeatability) does not meet a tolerance, the reference plane is reoriented, e.g., by rotating it about an X and/or Y orthogonal axes (each of which may be perpendicular to gravity) and a new gravity stable position of the workpiece is determined. In this way, a perfectly adequate workpiece will not be unnecessarily discarded, recycled, or reworked.

Figure 1A:
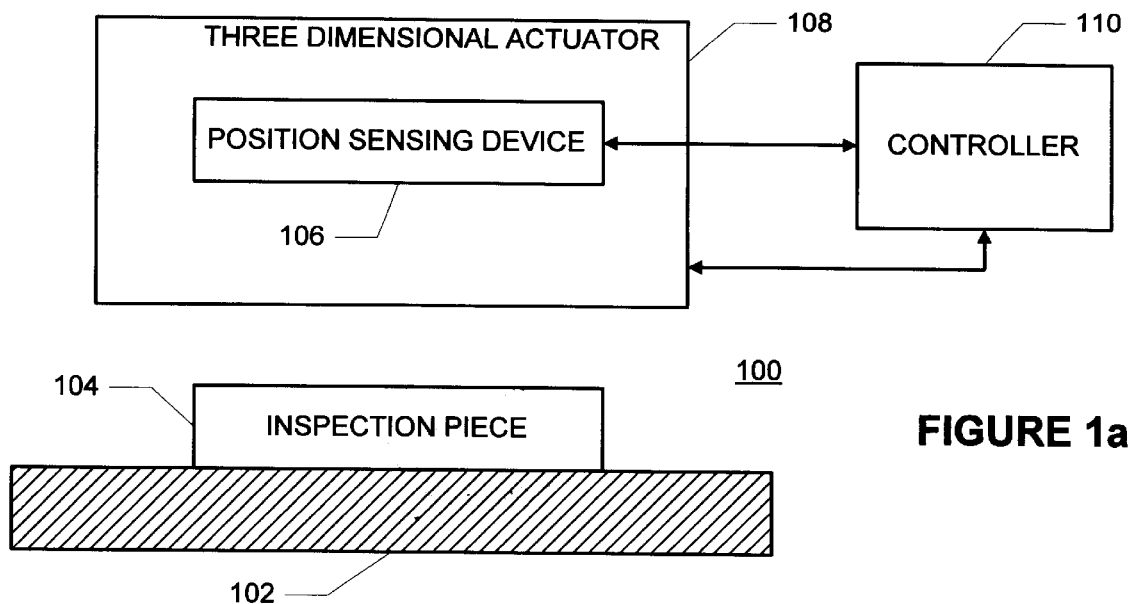
FIGS. 1a and 1b are block diagrams of alternative exemplary embodiments of the present invention.
Figure 13:
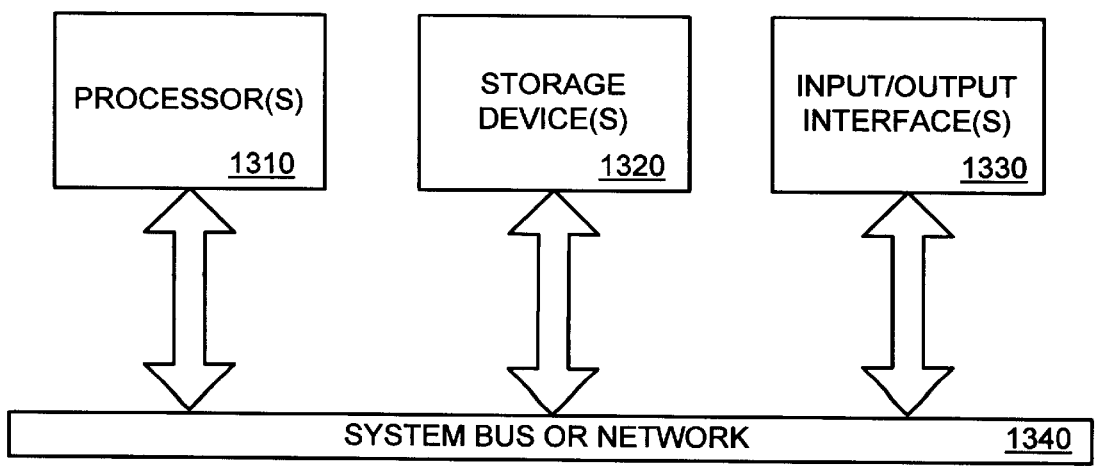
FIG. 13 is a block diagram of components which may be used in the controller of FIGS. 1a and 1b.

Having described the functions of the present invention, an exemplary structure for performing the present invention is now described with reference to FIGS. 1a, 1b, and 13. FIG. 1a is a block diagram of system 100 in which a position sensing device 106 is actuated, by means of a three dimensional actuator 108, relative to a fixed inspection piece (i.e., a workpiece) 104 on a surface 102. In the examples discussed below, the inspection piece 104 will be a surface mount component. In such cases, the inspection piece 104 may be laid on the surface 102 so that its leads extend upward (i.e., "dead-bug"). The position sensing device 106 may be a laser system. The three dimensional actuator may include axial drive or stepping motors.

The position sensing device 106 may be controlled by, and provide data (e.g., measurements) to, a controller 110. Similarly, the three dimensional actuator 108 may be controlled by, and provide data (e.g., regarding its relative position) to, the controller 110. The controller 110 may be a computer such as a personal computer. Referring to FIG. 13, the controller 110 may include a system 1300 having one or more processors 1310, one or more storage devices 1320, and one or more input/output interface(s) 1330, all of which may share a system bus 1340 or communicate via a network 1340. The processor(s) 1310 may include a Pentium microprocessor sold by Intel Corporation. The storage device(s) 1320 may include RAM, ROM, magnetic disk storage, optical disk storage, cache memory, etc. Program instructions which, when executed by the processor(s) 1310, effect the invention may be stored in the storage device(s) 1320 or may be downloaded from an external source. The input/output interface(s) 1330 may include appropriate interfaces for external input devices (e.g., keyboard, mouse, switches, etc.), external output devices (e.g., a video display monitor, a printer, a plotter, a loudspeaker, etc.), external storage devices (e.g., a SCSI disk drive), and external network components (e.g., a network interface card, a modem, a terminal adapter, etc.).

Figure 1B:
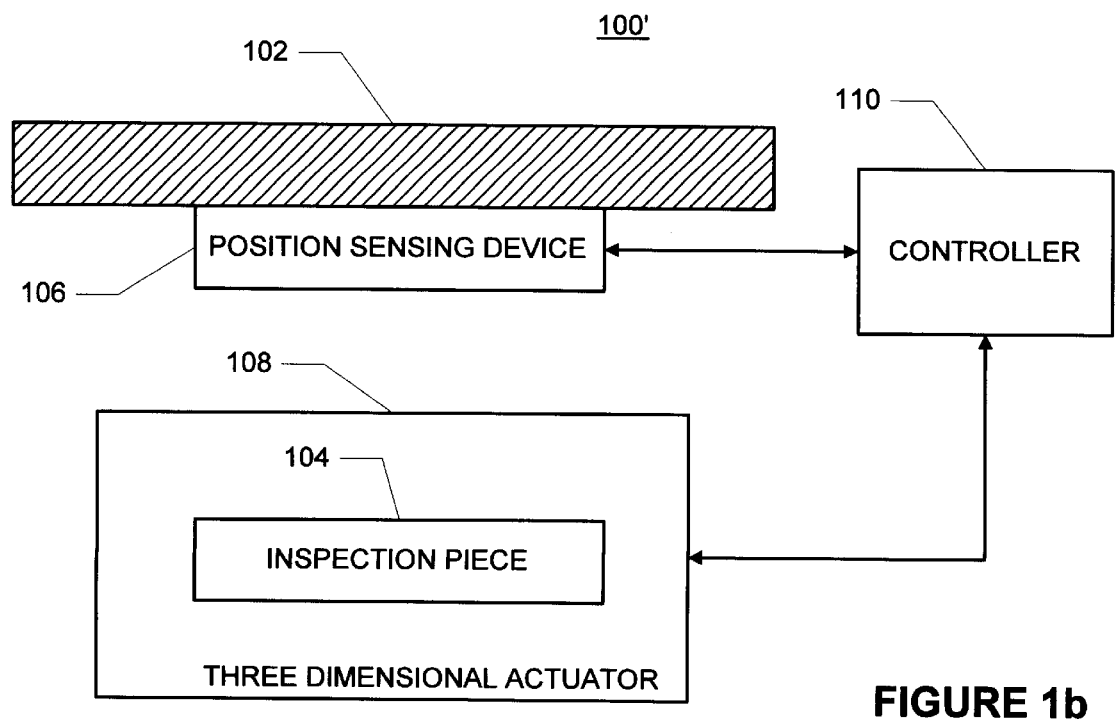

FIG. 1b is a block diagram of an alternative embodiment 100' of the system of the present invention. The components of the alternative embodiment 100' of FIG. 1b are similar to those of the embodiment 100 of FIG. 1a. However, in the alternative embodiment 100', the inspection piece 104 is moved, by means of three dimensional actuator 108, with respect to a fixed position sensing device 106. Naturally, it is possible to have a further alternative embodiment in which both the inspection piece 104 and the position sensing device 106 are actuated.

Figure 14:
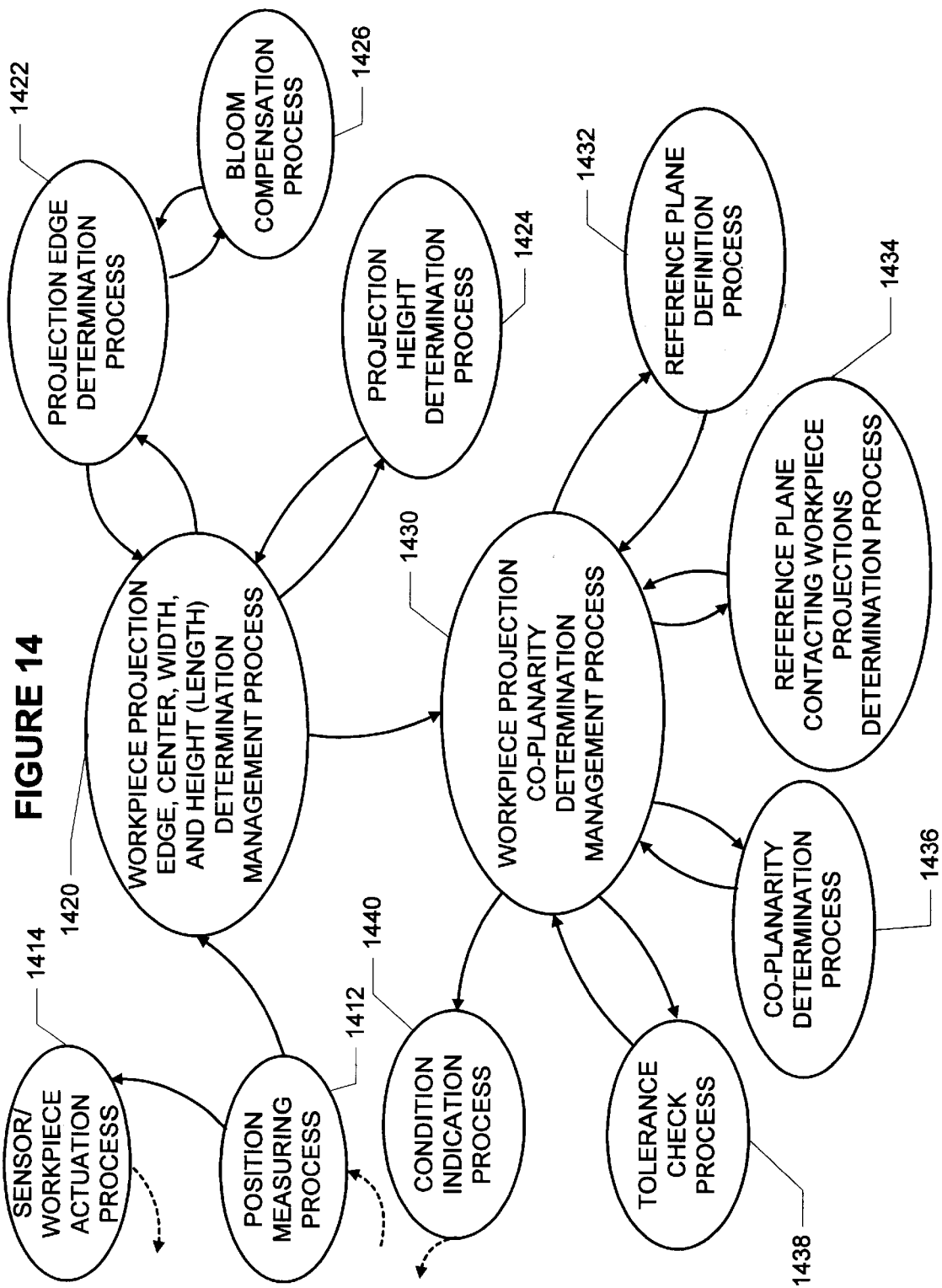
FIG. 14 is bubble diagram of processes that may be used to carry out the present invention.

FIG. 14 is a bubble diagram of processes which may be carried out by an exemplary apparatus of the present invention. As shown in FIG. 14, the processes may include a position measuring process 1412, a sensor/workpiece actuation process 1414, a workpiece projection (e.g., a surface mount device lead) edge, center, width, and height (length) determination management process 1420, a projection edge determination process 1422, a projection height determination process 1424, a bloom compensation process 1426, a workpiece projection co-planarity determination management process 1430, a reference plane definition process 1432, a reference plane contacting workpiece projections determination process 1434, a co-planarity determination process 1436, a tolerance check process 1438, and a condition indication process 1440. Referring to FIGS. 1a, 1b, 13, and 14, the position measuring process 1412 may be carried out by the position sensing device 106 and the controller 110. The sensor/workpiece actuation process 1414 may be carried out by the three dimensional actuator 108 and the controller 110.

The workpiece projection edge, center, width, and height (length) determination management process 1420 may receive position measurements from the position measuring process 1412 via a communications link and an input/output interface 1330. The workpiece projection edge, center, width, and height (length) determination management process 1420, as well as the associated projection edge determination process 1422, the projection height determination process 1424 and the bloom compensation process 1426, may be carried out by a processor(s) 1310 executing program instructions. To reiterate, the program instructions may be stored on the storage device(s) 1320 or received from an external source via the input/output interface(s) 1330. These processes may be controlled, in part, by user input entered via an input device (not shown) coupled with the input/output interface(s) 1330.

Similarly, the workpiece projection co-planarity determination management process, as well as the associated reference plane definition process 1432, the reference plane contacting workpiece projections determination process 1434, the co-planarity determination process 1436, and the tolerance check process 1438 may be carried out by a processor(s) 1310 executing program instructions. Again, the program instructions may be stored on the storage device(s) 1320 or received from an external source via the input/output interface(s) 1330. These processes may be controlled, in part, by user input entered via an input device (not shown) coupled with the input/output interface(s) 1330.

Finally, the condition indication process 1440 may be carried out by an output device such as a video monitor, indicator lights, loud speaker, etc. (not shown) under control of an indication signal generated by the processor(s) 1310 and provided to the output device via the input/output interface(s) 1330.

Figure 3:
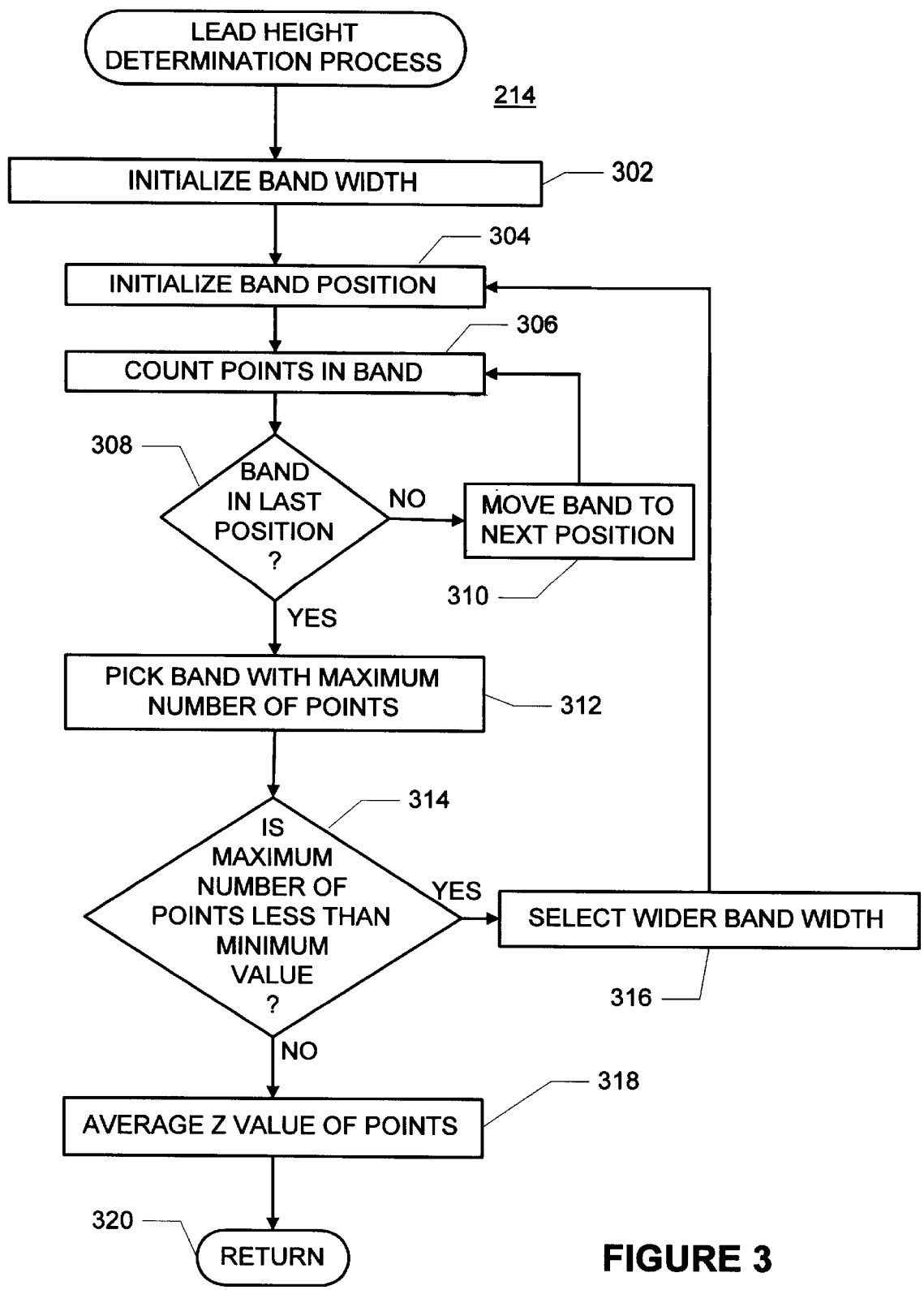
FIG. 3 is a flow diagram of an exemplary lead height (or length) determination process which may be used in the process of FIG. 2.
Figure 12:
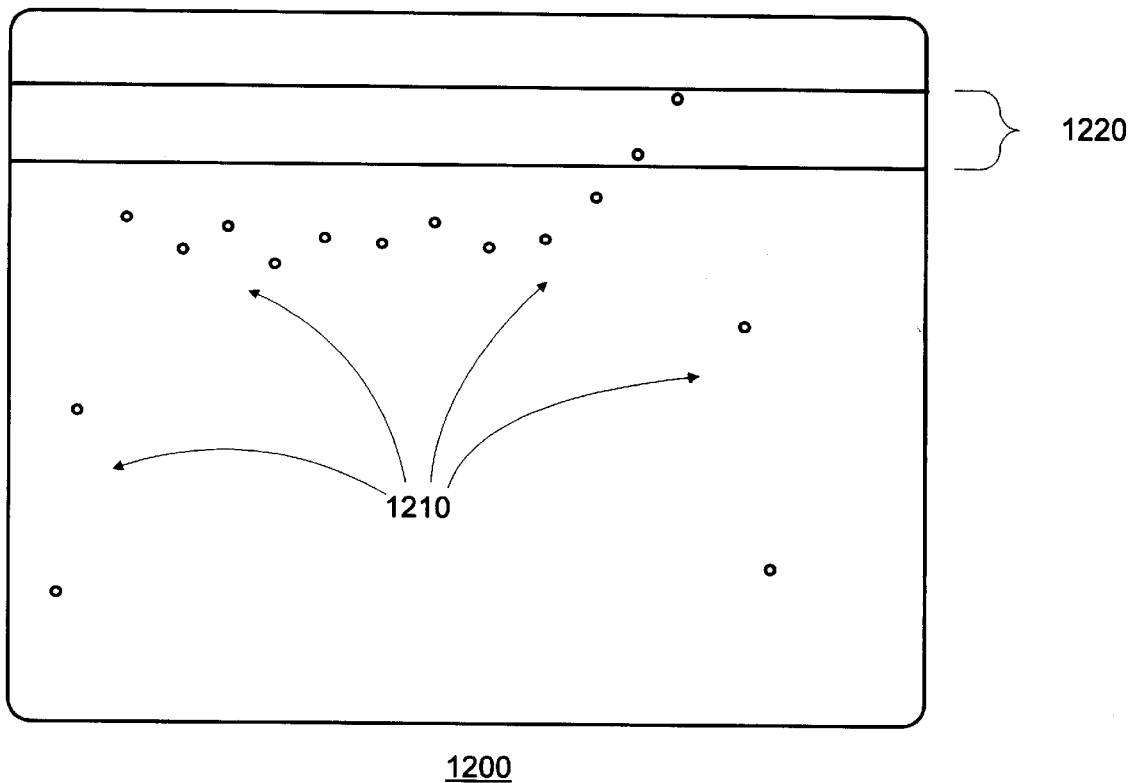
FIG. 12 depicts a screen display which illustrates a manner in which lead height (length) and width can be determined.

FIG. 3 is a flow diagram of a lead height (length) determination process 214 (See, e.g., 1424 of FIG. 14). FIG. 12 depicts a screen display 1200 which illustrates a manner in which lead height (length) and width can be determined. (See, e.g., processes 1412, 1420, 1422, and 1424 of FIG. 14.) The screen display 1200 includes a two dimensional scan of readings from the position measuring process 1412. In the context of inspecting leads of a surface mount component, the motor speed of the sensor/workpiece actuation process 1414 and the scan rate of the position measuring process 1412 may be adjusted (via a user interface, not shown) so that 10 to 15 readings per lead are acquired. The readings from one lead are depicted as small circles 1210.

An exemplary projection (e.g., lead) height (length) determination process 214/1424 is now described. A band 1220 is arranged on the screen to include a top-most point 1210. Referring to FIG. 3, the width of the band and its position are initialized as shown in steps 302 and 304, respectively. Next, as shown in step 306, the number of points 1210 within the band 1220 is determined. If the band is not at its last position, the band 1220 is moved to a next position (e.g., stepped down) and the number of points 1210 within the band 1220 is again determined as shown in steps 308, 310, and 306. This process continues until the band reaches the last position of the scan. After the scan is complete, as shown in step 312, a position corresponding to the band 1220 containing the most points 1210 is chosen. If, after a scan, the number of points 1210 within the chosen band 1220 does not meet a preset minimum number, the band 1220 is made wider and the process is repeated until the minimum number of points within a band is reached in a scan or if the band has reached a predetermined maximum width. (See, e.g., steps 314 and 316 of FIG. 3.) As shown in step 318, the height of the points 1210 within the chosen band, which includes the required number of points, are averaged to obtain a lead height value. Processing then continues at return node 320.

In one embodiment, the width of the band 1220 may initially correspond to 0.0005 inch, and may increase by steps of 0.0005 inch until a maximum band width of 0.0015 inch is met. The length of a scan may be 0.006 inch. Thus, initially twelve (12) 0.0005 inch bands 1220 may be used in a 0.006 inch scan. At the end, four (4) 0.0015 inch bands 1220 may be used in a 0.006 inch scan. A lead height is considered to be within a band if 60 percent of the points 1210 are within that band 1220.

Lead edges may be similarly determined using vertical bands (not shown). However, in the context of measuring surface mount component leads with a laser position detection system, additional processing (See, e.g., bloom compensation process 1426 of FIG. 14) may be necessary. More specifically, some laser position detection systems experience response time delays when going from the detection of very light surfaces to the detection of very dark surfaces and vise versa. Typically, laser units adjust the power to the laser diode so that a position sensing device receives signals of about the same intensity. For example, if measuring a dark surface, the laser power increases since a greater portion of the laser is absorbed by the dark surface and less is reflected back to the position sensing device. On the other hand, on bright surfaces, such as tin leads for example, the laser power is reduced since more of the laser is reflected back to the position sensing device. When transiting from the dark spaces between leads to the bright leads, the laser unit needs time to adjust (i.e., decrease) its power. A time lag in the power decrease of the laser may cause "blooming". Similarly, when transiting from the bright leads to the dark spaces between leads, the laser unit needs time to adjust (i.e., increase) its power. Consequently, the readings from the position sensing device are not as accurate while these laser power adjustments are taking place. As a result, the position data tend to show an edge deformation which may not actually exist.

To illustrate the occurrence of blooming, FIG. 15 depicts lead position readings 1520 with reference to actual lead positions shown by dashed line 1510. If the laser is scanning from left to right (i.e., in the positive X direction), the points 1522 depict blooming, and the points 1524 depict errors caused by time delays in increasing the laser power. The bloom compensation process 1426 may (i) define a vertical line 1540 based on vertical points, (ii) define a horizontal line 1530 based on horizontal points, and (iii) determine an X-coordinate of a lead edge at a point 1550 where the vertical 1540 and horizontal 1530 lines intersect. The vertical 1540 and horizontal 1530 lines may be least squared fit lines.

Once the lead edges are determined, a lead center value can be easily determined, e.g., by averaging the two (2) lead edge values. These center (or true position) values can be compared to acceptable lead true positions to determine if the product has passed this part of the inspection.

Figure 2:
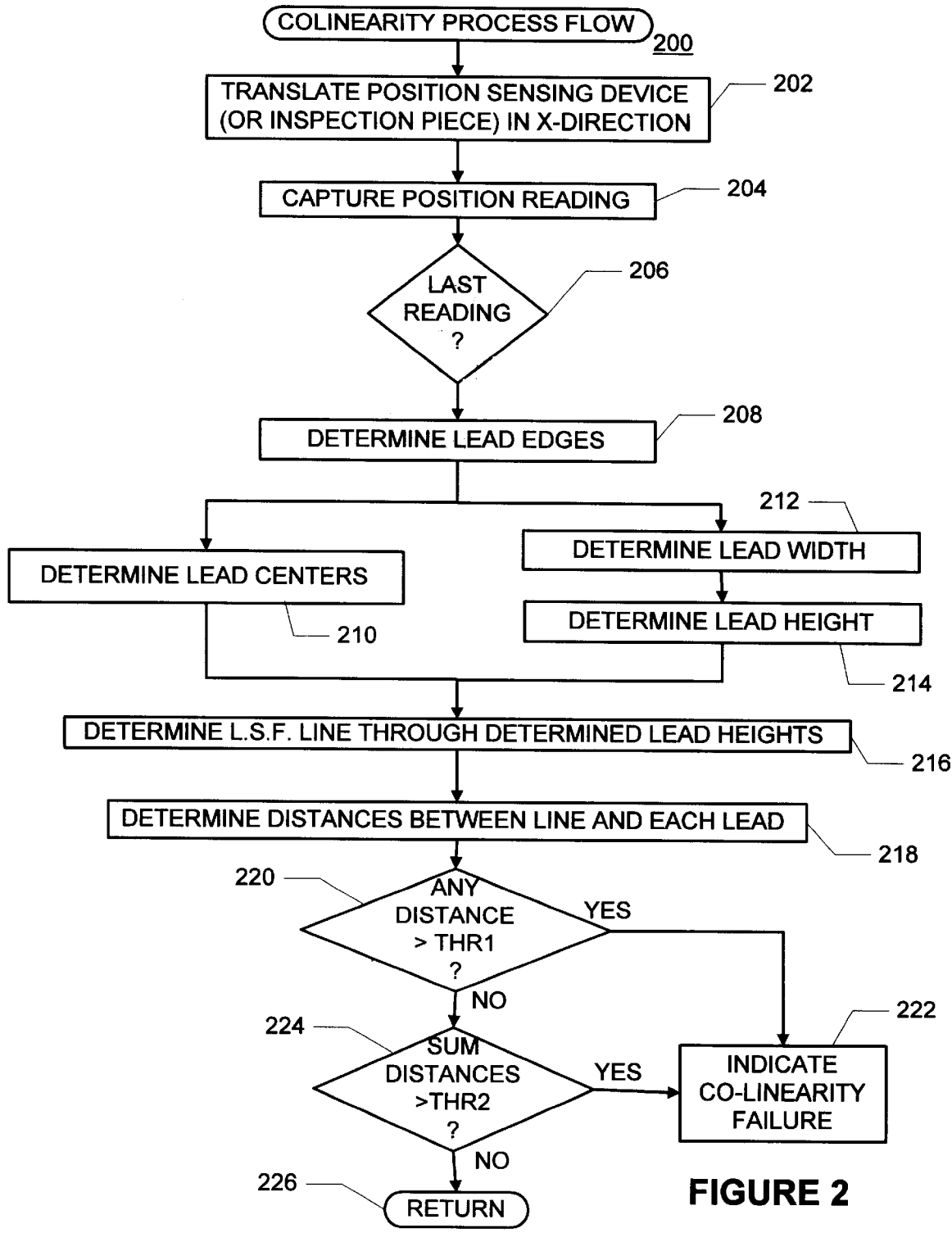
FIG. 2 is a flow diagram of an exemplary co-linearity process carried out in accordance with the present invention.

If the leads are supposed to be in-line, then a co-linearity determination can be made. FIG. 2 is flow diagram of a co-linearity determination process 200. To reiterate, the position sensing device and the inspection piece are translated relative to one another (step 202) and position readings are captured (step 204). As discussed above, lead edges (step 208), centers (step 210), widths (step 212) and heights (step 214) are determined. Then, as shown in step 216, a line is fit to the heights of the leads using the least squares fit method.

Next, as shown in step 218, the distance (absolute value) between each of the leads and the line is determined. As shown in steps 220 and 222, if any of the distances (absolute value) exceeds a first threshold value, the product will fail inspection. In addition, a sum of the distances may be compared to a second threshold value. As shown in steps 224 and 222, if the sum of the distances exceeds the second threshold value, the product will fail inspection.

The workpiece projection co-planarity determination management process 1430 will now be described. However, as an initial matter, a gravity stable arrangement of a workpiece (e.g., a surface mount component) on a reference plane will be described with reference to FIGS. 4a through 6b to facilitate the readers's understanding of the concept of being "gravity stable".

FIG. 4a is a plan view of a workpiece (e.g., a surface mount component) 410 having downwardly extending projections (e.g., leads), three (3) of which 422, 424, and 426 are shown. The workpiece 410 has a center of gravity at point 430. Referring to the side elevation view of FIG. 4b, the workpiece 410 is lowered onto a surface 490. The surface 490 defines a reference plane with which gravity is normal. As shown in FIG. 4b, the longest projection (e.g., lead) 426 contacts the reference plane defined by the surface 490 first. The projection 426 may be referred to as the first projection.

Referring back to FIG. 4a, the workpiece 410 will rotate about the line 450 towards the center of gravity 430 as shown by the curved arrow 452. The line 450 (i) is perpendicular to the line 440 between the center of gravity 430 and the first projection 426 and (ii) intersects the first projection 426. Thereafter, as shown in FIG. 5b, the projection (e.g., lead) 424 of the workpiece 410 will contact the reference plane defined by the surface 490. Thus, the projection 424 may be referred to as the second projection.

As shown in FIG. 5a, the workpiece 410 will then rotate about the line 460 towards the center of gravity 430 as shown by the curved arrow 462. The line 460 passes through the second projection 424 and first projection 426 which contact the surface 490. Finally, as shown in FIG. 6b, the projection 422 contacts the reference plane 490. Thus, the projection 422 may be referred to as the third projection. Referring to FIG. 6a, since the center of gravity 430 is contained within a triangle defined by the points 422, 424, and 426 of the projections, the workpiece 410 is "gravity stable". If on the other hand, the center of gravity 430 was not contained within the triangle defined by the points 422, 424, and 426 of the projections, the workpiece 410 would not be "gravity stable" and a next projection (not shown) would come into contact with the surface 490.

Once the workpiece is gravity stable, the co-planarity of the projections (e.g., leads) can be determined. More specifically, the distance from the reference plane to the bottom of each projection is determined. The greatest distance is taken as a co-planarity value for the workpiece. Referring to the plan view of FIG. 7a, it is assumed that projections (e.g., lead) 722, 724, and 726 of workpiece 710 contact a reference plane. It is further assumed that the center of gravity (not shown) of the workpiece 710 is contained within a triangle defined by the projection points 722, 724, and 726 such that the workpiece 710 is gravity stable.

The location of the gravity stable projections 722, 724, and 726 affect the repeatability of the derived co-planarity. If, for example, the three (3) gravity stable projections are close to the center of gravity thereby forming a tight triangle, and the lead furthest from the reference plane is at a far end of the workpiece, then even slight variations in projection (e.g., lead) height measurements can cause the co-planarity to vary relatively greatly thereby generating a co-planarity value having a relatively poor repeatability. This situation is shown in FIGS. 7a and 7b where the lead 728 is the most distant from the reference plane.

Referring to FIG. 7b, assuming that (i) the repeatability of the position sensing system is about 0.0003 inch and (ii) $d_{BD}$ is ten (10) times greater than $d_{BA}$, then the repeatability of the co-planarity ($V_{CP}$) at projection 728 is 0.006 inch. More specifically, projection 722 can be 0.0003 inch shorter than determined (measured) and projection 726 can be 0.0003 inch longer than determined (measured). (0.006=10* (0.0003+0.0003)). Recall that a typical tolerance for co-planarity in surface mount devices is 0.004 inch. Thus, the repeatability of the co-planarity derivation of the inspection system in this case (0.006 inch) is greater than the tolerance (0.004 inch). Typically, the repeatability should be no more than ten (10) percent of the tolerance.

Co-planarity repeatability may be improved if the gravity stable projections form a larger triangle. Referring to FIG. 8a, suppose the projections 822, 824, and 826 define the gravity stable projections and the projection 828 is the most distant from the reference plane. Like the example in FIG. 7, assume that the repeatability of the position sensing system is about 0.0003 inch. However, in this case, the distance $d_{BA}$ is ten (10) times $d_{BD}$. Thus, in this case, the repeatability of the co-planarity ($V_{CP}$) at projection 828 is 0.00006 inch. More specifically, projection 822 can be 0.0003 inch shorter than determined and projection 826 can be 0.0003 inch longer than determined. (0.00006=0.1* (0.0003+0.0003)).

In view of the foregoing, to improve the repeatability of the co-planarity determination, the gravity stable projections should define a larger triangle. The present invention permits the reference plane to be varied so that it is possible to get different, better, gravity stable projections.

Figure 9:
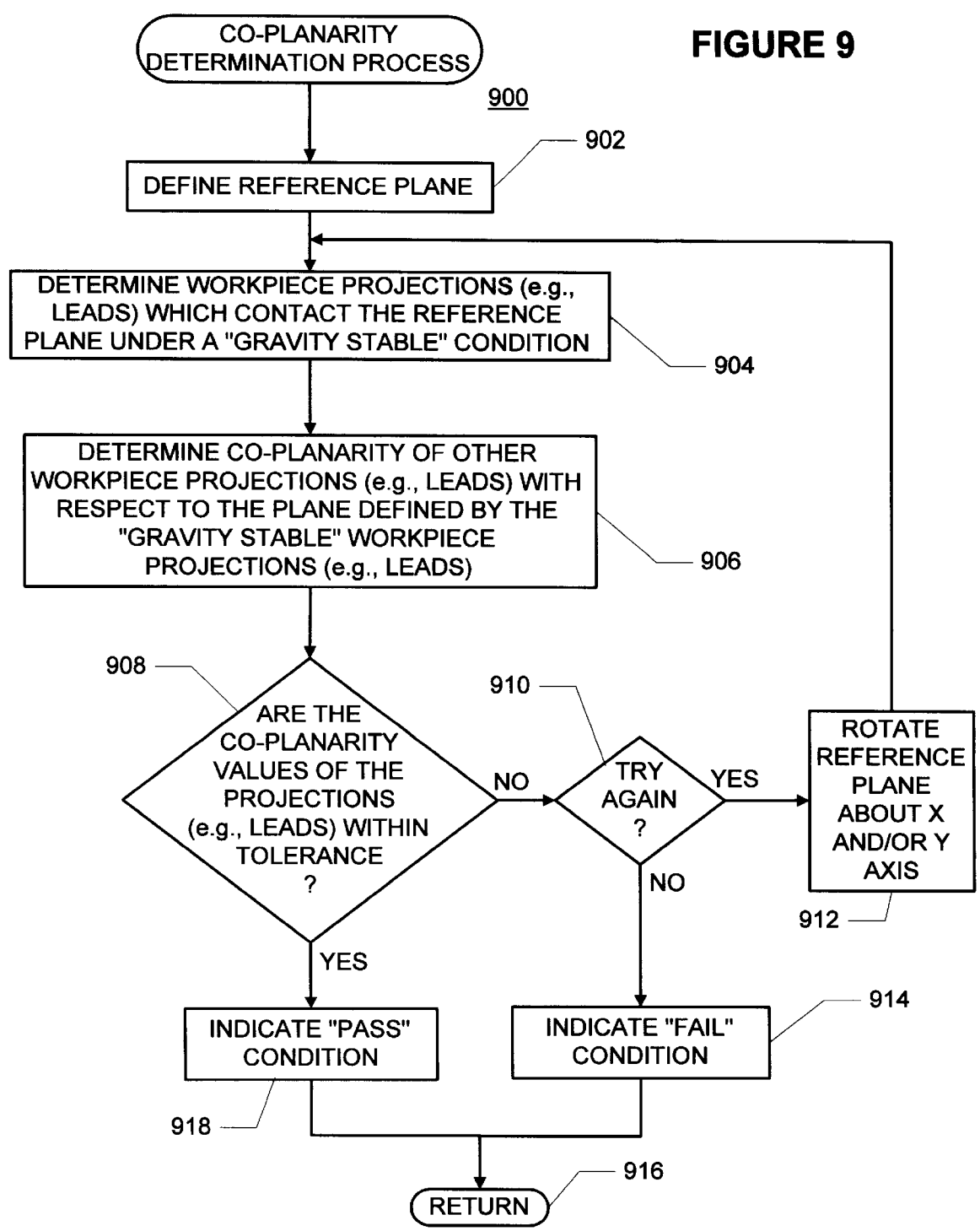
FIG. 9 is a flow diagram of an exemplary co-planarity determination process carried out in accordance with the present invention.

FIG. 9 is a flow diagram of a co-planarity determination process 900 performed in accordance with the present invention (See, e.g., process 1430 of FIG. 14). First, as shown in step 902, a reference plane is defined (See, e.g., process 1432 of FIG. 14). Although the initial reference plane is arbitrary, a reference plane to which gravity is normal is preferred. Next, as shown in step 904, workpiece projections (e.g., leads) which contact the reference plane under a "gravity stable" condition are determined (See, e.g., process 1434 of FIG. 14). The details of this determination will be described below with reference to FIGS. 10a through 11i. Thereafter, as shown in step 906, the co-planarity of other workpiece projections (e.g., leads) with respect to the plane defined by the "gravity stable" workpiece projections is determined (See, e.g., process 1436 of FIG. 14). Recall that the co-planarity derivation was discussed above with reference to FIGS. 7a through 8b. Next, as shown in step 908, the co-planarity values of the projections (or the maximum co-planarity value) is compared with a tolerance value to determine whether the co-planarity is within tolerance (See, e.g., process 1438 of FIG. 14). This may be carried out by a simple comparison. Naturally, the repeatability of the derivation of co-planarity is considered.

If the co-planarity is within tolerance, a "pass" condition is indicated (See, e.g., process 1440 of FIG. 14) as shown in step 918 and processing continues are return node 916. Referring back to FIG. 13, the "pass" condition indication may be provided by a video display monitor or other light or audible output device (not shown) coupled with an input/output interface 1330. If, on the other hand, the co-planarity (with its repeatability) is not within tolerance which may be due to a relatively poor repeatability, it is determined whether another co-planarity derivation is to be performed at step 910. A predetermined number of attempts may be used to determine whether another co-planarity derivation is to be carried out. Alternatively, a user response may be used to determine whether another co-planarity derivation is to be carried out.

If, as shown in step 914, no more tries are to be carried out, a "fail" condition is indicated (See, e.g., process 1440 of FIG. 14). Like the "pass" condition, the "fail" condition may be provided by a video display monitor or other light or audible output device (not shown) coupled with the input/output interface 1330. If, on the other hand, another co-planarity derivation is to be carried out, the reference plane is rotated about an X and/or Y axis. In this case, the X and Y axis are orthogonal and perpendicular to "gravity". A predetermined sequence of reference plane rotations may be employed for a sequence of tries. For example, the following predetermined sequence of reference plane rotations may be used.

| TRY NUMBER | ROTATION ABOUT X AXIS (DEGREES) | ROTATION ABOUT Y AXIS (DEGREES) |
| --- | --- | --- |
| 1 | 0 | 0 |
| 2 | 0 | +5 |
| 3 | 0 | −5 |
| 4 | +5 | 0 |
| 5 | −5 | 0 |
| 6 | +5 | +5 |
| 7 | +5 | −5 |
| 8 | −5 | +5 |
| 9 | −5 | −5 |
| 10 | 0 | +10 |
| 11 | 0 | −10 |

Once the reference plane is varied, processing continues at step 904.

Figure 10B:
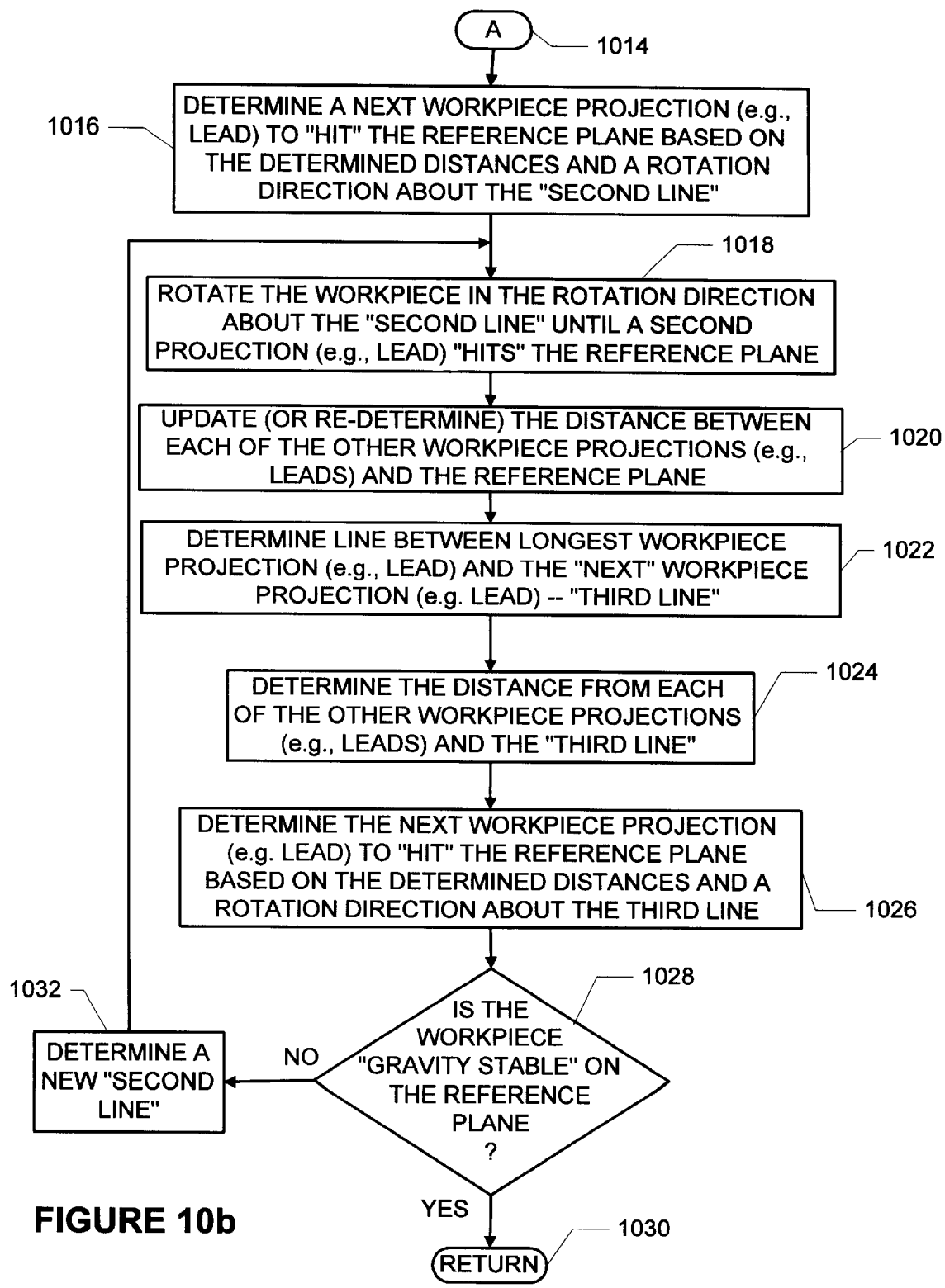
FIG. 10 depicts an arrangement of FIGS. 10a and 10b which, collectively, depict a flow diagram of an exemplary process for determining workpiece projections which contact a reference plane under a gravity stable condition.

Recall that step 904 of FIG. 9 determines workpiece projections (e.g., leads) which contact the reference plane under a gravity stable condition. FIG. 10, which includes FIGS. 10a and 10b, is a flow diagram of an exemplary process 904 for making such a determination. FIGS. 11a through 11i illustrate some of the steps of the process 904.

First, as shown in step 1002, the center of gravity of the workpiece is accepted or determined. The determination of the center of gravity may be carried out in a known way. As shown in step 1004, the planar locations (e.g., the X and Y axis coordinates in the Z=0 plane) and the lengths (e.g., Z coordinates) of the projections (e.g., leads) of the workpiece are determined. Referring to FIG. 14, this information may be provided to the workpiece projection co-planarity process 1430 from the process 1420.

Figure 11A:
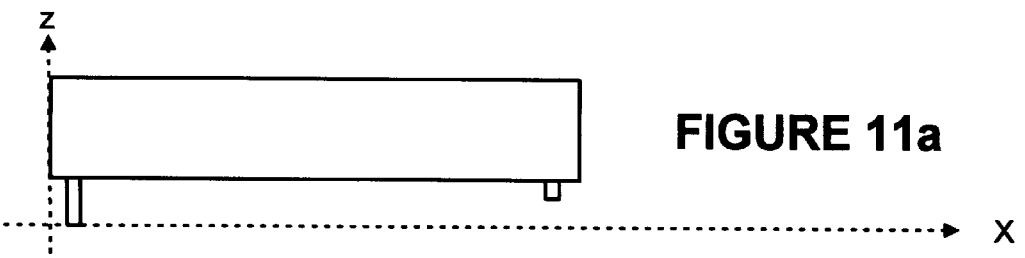
FIGS. 11a through 11i are diagrams, of a dual in line surface mounted device having leads, which illustrate the operation of the process of FIG. 10.
Figure 11B:
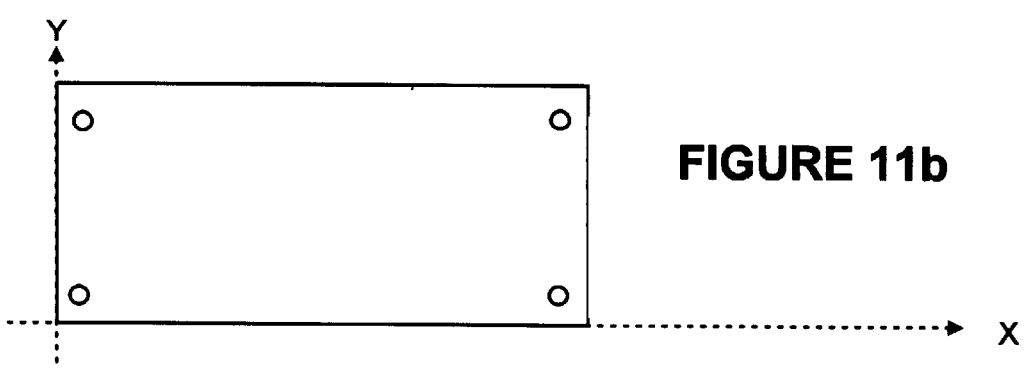
Figure 11C:
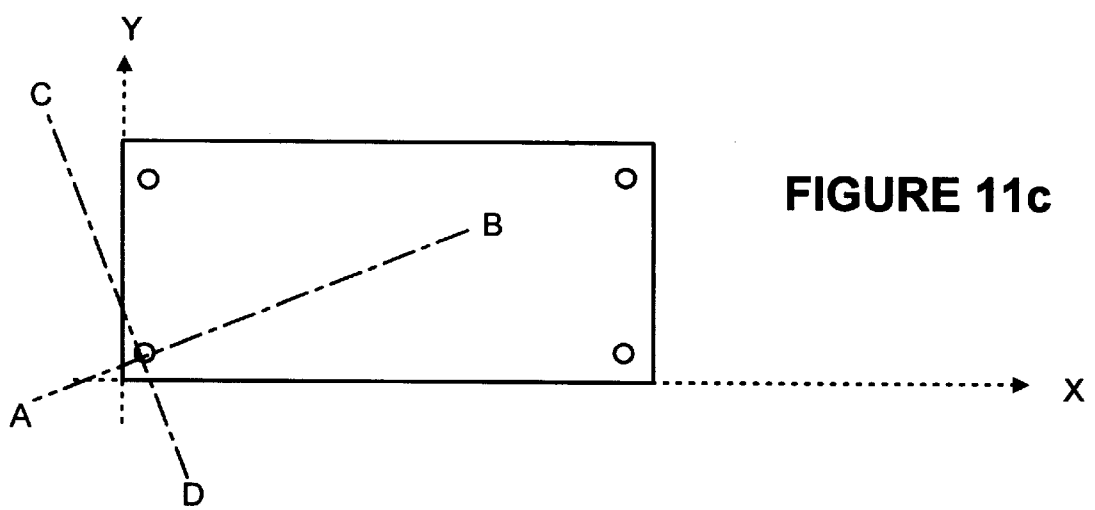

Next, assuming that the reference plane at issue is one to which gravity is normal, a line between the longest workpiece projection (e.g., lead) and the center of gravity of the workpiece is determined as shown in step 1006. This line is referred to as the first line. If a different reference plane is being used, the first line is a line between the workpiece projection (e.g., lead) closest to the reference plane and the center of gravity. Referring to FIGS. 11a and 11b, the lead 1 is the longest lead (i.e., the closest lead to the reference plane Z=0. Referring to FIG. 11c, the line AB corresponds to the first line. Then, as shown in step 1008, a line perpendicular to the first line and intersecting the longest projection (e.g., lead) (or the lead closest to the reference plane) is determined. This line is referred to as the second line. Referring again to FIG. 11c, the line CD corresponds to the second line.

Figure 11D:
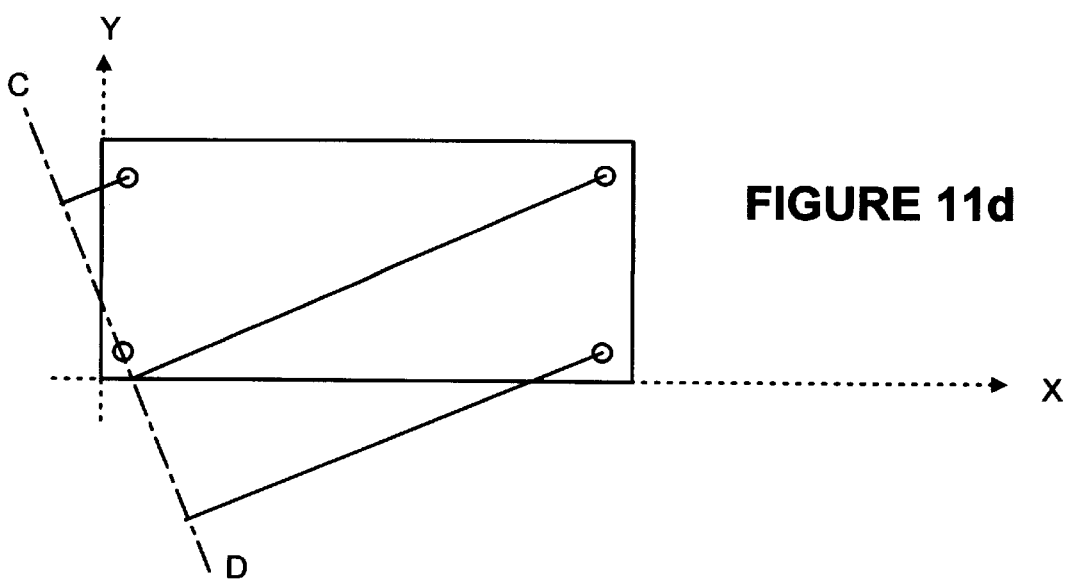

Next, as shown in step 1010, a distance between the bottom of each of the other workpiece projections (e.g., leads) and the reference plane is determined. This can be determined by taking a difference between the length of the projection (e.g., lead) contacting the reference plane and the lengths of the other projections (e.g., leads). In reference planes with which gravity is not normal, such distances may be based on the lead lengths and workpiece/reference plane geometrical orientation. In addition, as shown in step 1012, a distance from each of the other workpiece projections (e.g., leads) and the second line are determined. An example of these distances is shown in FIG. 11d. Processing continues, via node A 1014, from FIG. 10a to FIG. 10b.

Figure 11E:
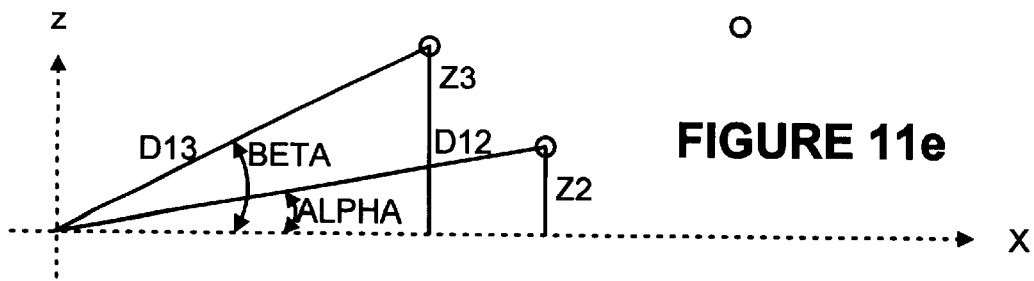

Next, as shown in step 1016, a next workpiece projection (e.g., lead) to "hit" the reference plane is determined based on the distances determined in steps 1010 and 1012, as well as a rotation direction about the second line. Referring to FIGS. 11c, 11d, and 11e, since the center of gravity of the workpiece will continue to fall towards the reference plane, the workpiece will rotate clockwise, about line CD. Referring to FIG. 11e, since the distances between the leads 1 and 2 (D12) and 1 and 3 (D13) are known, and the distances between the leads and the reference plane (Z=0) are known (Z2 and Z3), the angle $\alpha$ can be determined by the arcsine of Z2/D12 and the angle $\beta$ can be determined by the arcsine of Z3/D13. Once these determinations are made, the projection (e.g., lead) which is rotating towards the reference plane and which is associated with the minimum angle is determined as the next projection (e.g., lead) to hit the reference plane.

Figure 11F:
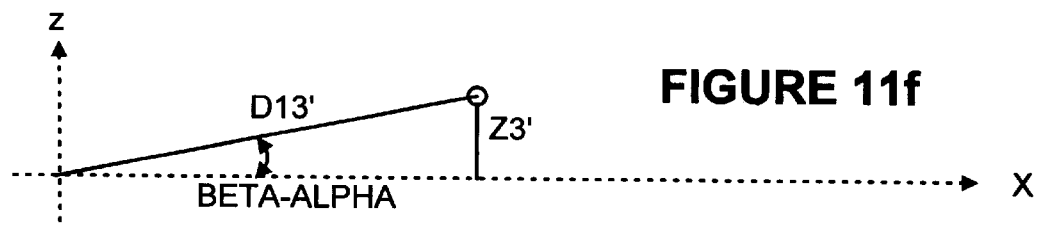

Next, as shown in step 1018, the workpiece is rotated towards the reference plane about the second line until the second projection (e.g., lead) hits the reference plane. Referring to FIG. 11f, this is shown when the bottom of lead 2 is at Z=0.

Thereafter, as shown in step 1020, the distances between each of the other projections (e.g., leads) and the reference plane are updated based on the rotation carried out in step 1018. Referring to FIG. 11f for example, the new value Z3' can be determined as D13 * sin ($\beta-\alpha$).

Figure 11G:
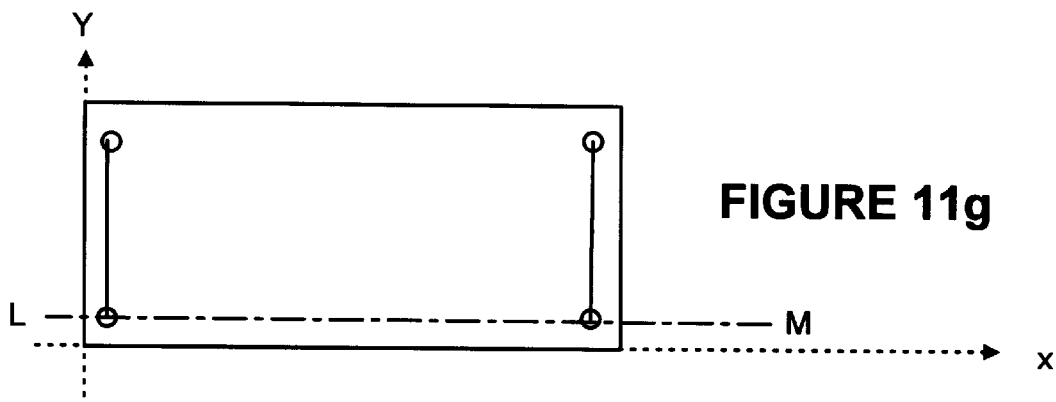

Next, as shown in step 1022, a line between the two workpiece projections (e.g., leads) in contact with the reference plane is determined. This line is referred to as the third line. Referring to FIG. 11g, line LM corresponds to the third line. Next, as shown in step 1024, distances between the remaining workpiece projections (e.g., leads) and the third line are determined. These distances are shown in FIG. 11g.

Figure 11H:
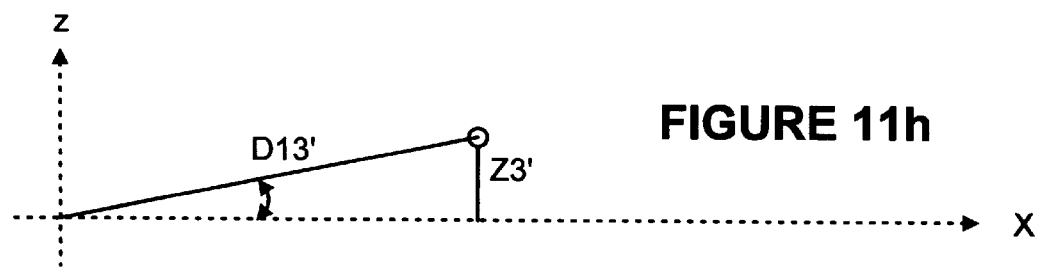
Figure 11I:
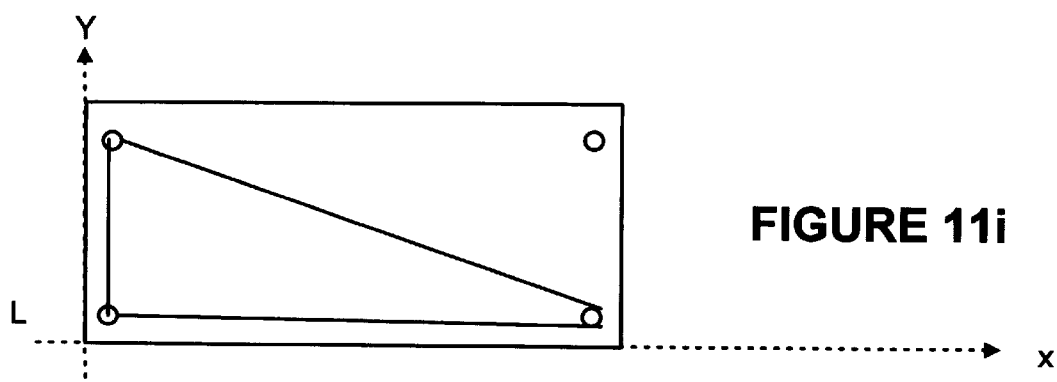

Similar to step 1016 discussed above, in step 1026, a next workpiece projection (e.g., lead) to hit the reference plane is determined based on the determined distances and a rotation direction about the third line (See FIG. 11h).

Once three projections (e.g., leads) are determined to have hit the reference plane, it is determined whether the workpiece is "gravity stable" on the reference plane as shown in step 1028. Basically, the workpiece will be "gravity stable" if the center of gravity of the workpiece is contained within a triangle defined by the projections (e.g., leads) in contact with the reference plane. For example, referring to FIG. 11i, since the center of gravity CG of the surface mount component is within a triangle defined by the lead positions 1, 2, and 3, the component is gravity stable on the reference plane Z=0. If the workpiece is gravity stable, processing continues at return node 1030. If, on the other hand, the workpiece is not gravity stable, a new "second line" is determined (e.g., between the first and third or second and third projections to contact the reference plane), as shown in step 1032, and processing continues at step 1018. If more than one new "second line" is possible, the line farthest from the workpiece center of gravity may be selected.

Thus, the present invention advantageously permits a co-planarity inspection to be carried out and permits a repeatability of the co-planarity to be optimized.

What is claimed is:

1. A method for inspecting a workpiece having projections, the method comprising steps of:
   a) accepting measurements of the workpiece;
   b) determining edges of each of the projections based on the measurements accepted;
   c) determining a height of each of the projections based on the measurements accepted; and
   d) determining a center of each of the projections based on the edges determined.

2. A method for inspecting a workpiece having projections, to determine a height of each of the projections, the method comprising steps, for each of the projections, of:
   a) determining a width of a measurement sampling band;
   b) initializing a position of the measurement sampling band;
   c) counting a number of measurements within the measurement sampling band at its current position to determine a first count;
   d) repositioning the band and repeating the step of counting the number of measurements within the measurement sampling band to determine a second count;
   e) selecting the maximum of the first and second counts to determine a maximum count; and
   f) averaging height values of measurements within the measurement sampling band associated with the maximum count to determine a projection height.

3. The method of claim 2 wherein, if the maximum count is less than a predetermined threshold, then further performing the steps of;
   (g) increasing a width of the measurement sampling band; and
   (h) repeating steps (b) through (f).

4. The method of claim 2 further comprising steps of:
   g) determining a least squares fit line through the determined projection heights;
   h) determining, for each of the projections, a distance between the projection and the least squares fit line; and
   i) determining whether a co-linearity of the workpiece is acceptable based on the determined least squares fit line and the determined distances.

5. The method of claim 4 wherein the step of determining whether a co-linearity of the workpiece is acceptable includes sub-steps of:
   i) determining whether any of the distances exceeds a first threshold value; and
   ii) if any of the distances exceeds the first threshold value, indicating a co-linearity failure.

6. The method of claim 4 wherein the step of determining whether a co-linearity of the workpiece is acceptable includes sub-steps of:
   i) determining a sum of the distances;
   ii) determining whether the sum of the distances exceeds a first threshold value; and
   iii) if the sum of the distances exceeds the first threshold value, indicating a co-linearity failure.

7. A method for inspecting a workpiece having projections, to determine an edge of each of the projections, the method comprising steps, for each of the projections, of:
   a) determining a width of a measurement sampling band;
   b) initializing a position of the measurement sampling band;
   c) counting the number of measurements within the measurement sampling band at its current position to determine a first count;
   d) repositioning the measurement sampling band and repeating the sub-step of counting the number of measurements within the measurement sampling band to determine a second count;
   e) selecting the maximum of the first and second counts to determine a maximum count; and
   f) averaging values of measurements within the measurement sampling band associated with the maximum count to determine a projection edge.

8. The method of claim 7 wherein, if the maximum count is less than a predetermined threshold, then further performing the steps of;
   (g) increasing a width of the measurement sampling band; and
   (h) repeating steps (b) through (f).

9. The method of claim 7 further comprising steps of:
   g) determining whether a bloom exists at the edge; and
   h) if a bloom exists at the edge, compensating the edge measurement to reduce the effect of the bloom.

10. A method for inspecting a workpiece having projections, to determine a co-planarity of the projections, the method comprising steps of:
    a) accepting length measurements of the projections;
    b) defining a reference plane;
    c) determining at least three projections which contact the reference plane under a gravity stable workpiece condition; and
    d) determining a co-planarity of the workpiece based on a distance of each of the projections to the reference plane under a gravity stable workpiece condition.

11. The method of claim 10 further comprising a step of:
    e) determining a variability of the co-planarity determined.

12. The method of claim 11 further comprising steps of:
    f) adding the variability of the co-planarity and the co-planarity to generate a value; and
    g) comparing the value to a predetermined tolerance.

13. The method of claim 12 wherein, if the value exceeds the predetermined tolerance, then further performing steps of:
    h) redefining the reference plane; and
    i) repeating steps (c) through (g).

14. The method of claim 13 wherein the step of redefining the reference plane includes a sub-step of rotating the reference plane about at least one of two orthogonal axes.

15. The method of claim 14 wherein each of the two orthogonal axes are perpendicular to gravity.

16. The method of claim 10 wherein the step of determining at least three projections which contact the reference plane under a gravity stable workpiece condition includes sub-steps of:
    i) accepting a center of gravity of the workpiece;
    ii) determining a projection closest to the reference plane to define a first projection;

iii) determining a line between the center of gravity and the first projection to define a first line;

iv) determining a line perpendicular to the first line and passing through the first projection to define a second line;

v) determining a direction of rotation about the second line towards the center of gravity;

vi) determining a distance, in the direction of gravity, between bottoms of each of the projections and the reference plane;

vii) determining a distance between each of the projections and the second line;

viii) determining a next projection to contact the reference plane, assuming that the workpiece rotates about the second line in the direction of rotation, based on (i) the determined distances between the bottoms of the projections and the reference plane and (ii) the determined distances between each of the projections and the second line, to define a second projection;

ix) determining a line between the first and second projections to define a third line;

x) updating a distance, in the direction of gravity, between bottoms of each of the projections and the reference plane;

xi) determining a distance between each of the projections and the third line; and xii) determining a next projection to contact the reference plane, assuming that the workpiece rotates about the third line towards the center of gravity, based on (i) the updated distances between the bottoms of the projections and the reference plane and (ii) the determined distances between each of the projections and the third line, to define a third projection.

17. The method of claim 16 wherein the step of determining at least three projections which contact the reference plane under a gravity stable workpiece condition includes a sub-step of (xiii) determining whether the workpiece is gravity stable.

18. The method of claim 16 wherein the step of determining at least three projections which contact the reference plane under a gravity stable workpiece condition includes a sub-step of (xiii) if the center of gravity is within a triangle defined by the first, second, and third projections, determining that the workpiece is gravity stable, and if the center of gravity is not within the triangle, determining that the workpiece is not gravity stable.

19. An apparatus for inspecting a workpiece having projections, the apparatus comprising:

a) means for accepting measurements of the workpiece;

b) means for determining edges of each of the projections based on the measurements accepted;

c) means for determining a height of each of the projections based on the measurements accepted; and d) means for determining a center of each of the projections based on the edges determined.

20. The apparatus of claim 19 further comprising e) means for determining whether a co-linearity of the workpiece is acceptable based on the determined heights of the projections.

21. The apparatus of claim 19 wherein the means for determining edges includes i) means for determining whether a bloom exists at an edge; and ii) if a bloom exists at the edge, means for compensating the edge measurement to reduce the effect of the bloom.

22. An apparatus for inspecting a workpiece having projections, to determine a co-planarity of the projections, the apparatus comprising:

a) means for accepting length measurements of the projections;

b) means for defining a reference plane;

c) means for determining at least three projections which contact the reference plane under a gravity stable workpiece condition; and d) means for determining a co-planarity of the workpiece based on a distance of each of the projections to the reference plane under a gravity stable workpiece condition.

23. The apparatus of claim 22 further comprising:

e) means for determining a variability of the co-planarity determined;

f) means for adding the variability of the co-planarity and the co-planarity to generate a value; and g) means for comparing the value to a predetermined tolerance.

24. The apparatus of claim 23 further comprising:

h) means, if the value exceeds the predetermined tolerance, for redefining the reference plane.

25. The apparatus of claim 22 further comprising:

e) means for acquiring the measurements accepted by the means for accepting.

* * * * *